United States Patent [19]

Nukui

[11] Patent Number: 5,313,412
[45] Date of Patent: May 17, 1994

[54] OVERSAMPLING TYPE FINITE IMPULSE RESPONSIVE FILTER

[75] Inventor: Yoshihiro Nukui, Gyoda, Japan
[73] Assignee: Advantest Corporation, Tokyo, Japan
[21] Appl. No.: 80,974
[22] Filed: Jun. 24, 1993

Related U.S. Application Data

[63] Continuation of Ser. No. 812,272, Dec. 23, 1991, abandoned.

[30] Foreign Application Priority Data

Dec. 28, 1990 [JP] Japan .................... 2-409094

[51] Int. Cl.⁵ .................................... G06F 15/31
[52] U.S. Cl. .................................... 364/724.16
[58] Field of Search .......................... 364/724.16

[56] References Cited

U.S. PATENT DOCUMENTS

| | | | |
|---|---|---|---|
| 4,423,488 | 12/1988 | Campbell | 364/724.16 |
| 4,484,299 | 11/1984 | Lambourn et al. | 364/724.16 |
| 4,701,873 | 10/1987 | Schenk | 364/724.16 |
| 4,794,555 | 12/1988 | Kojima et al. | 364/724.16 |
| 5,053,984 | 10/1991 | Cavallotti et al. | 364/724.16 |
| 5,103,416 | 4/1992 | Cavallotti et al. | 364/724.16 |
| 5,117,385 | 5/1992 | Gee | 364/724.16 |

OTHER PUBLICATIONS

Curtis A. Siller, Jr. et al., "Application of Memory-Based Digital Filtering to High-Speed Digital Radio", *AT&T Technical Journal*, vol. 69, No. 5, pp. 100–115, Sep. 1990, N.Y., US.

W. K. Jenkins et al., "The Use of Residue Number Systems in the Design of Finite Impulse Response Digital Filters", *IEEE Transactions on Circuits and Systems*, vol. CAS24, No. 4, pp. 191–201, Apr. 1977, New York, US.

*Primary Examiner*—David H. Malzahn
*Attorney, Agent, or Firm*—Staas & Halsey

[57] ABSTRACT

Digital data provided in the form of a serial signal is fetched into an N-bit shift register and parallel N-bit data output therefrom is provided as address data to address input terminals of a memory. In the memory there are prestored at respective addresses defined by the N-bit data the total sum value of multiplied outputs obtained by multiplying the address values and the bit data of a coefficient $h(n-i)$ defining an impulse response characteristic. The N-bit data is provided to an address input terminal of the memory to read out therefrom a digital value corresponding to the output voltage of a digital filter. The digital value is D/A converted to obtain the output voltage of the digital filter.

6 Claims, 7 Drawing Sheets

OVERSAMPLING TYPE FINITE IMPULSE RESPONSIVE FILTER

This application is a continuation of application Ser. No. 07/812,272, filed Dec. 23, 1991, now abandoned.

BACKGROUND OF THE INVENTION

The present invention relates to a digital filter which is commonly referred to as a FIR (Finite Impulse Response) filter and is used, for example, to restrict a digital data signal within a desired frequency band in the case of transmitting the signal.

With the use of a method which transmits a speech or image signal in digital form and decodes it to reproduce a speech or image, it is possible to reproduce a speech or image signal of good quality. Hence, attempts are now being made for digitization in the fields of, for example, radiotelephony, portable television cameras, and so forth.

According to a conventional digitization method, an analog signal from a signal source is converted by an A/D converter to a digital signal, the thus A/D converted output is further converted by a parallel-serial converter to a serial pulse train signal, which is provided to a modulator, wherein a carrier signal is subjected to an amplitude, frequency or phase modulation, and the modulated signal is transmitted. At the receiving side the transmitted signal is demodulated to obtain the pulse train signal. The pulse train signal is converted to parallel form to obtain parallel digital data, which is further converted by a D/A converter to digital form, thus reproducing an analog speech or image signal.

If the carrier is modulated with the pulse train signal held intact at the transmitting side, side bands centering about the carrier frequency will develop over a wide frequency range, because the pulse signal contains many higher harmonics. Hence the transmission occupies a wide frequency band. This defect could be overcome by restricting the frequency bandwidth of the modulation signal through use of an analog filter. With the analog filter, however, it is difficult to obtain a sharp attenuation characteristic. Moreover, even if a filter of a sharp attenuation characteristic is formed by, for example, a crystal resonator, the phase rotation will become more and more prominent as the attenuation characteristic becomes steeper.

When the pulse train signal is applied to a circuit of excessive phase rotation, jitters markedly develop owing to the phase rotation, resulting in the deterioration of transmission quality. In view of this, a digital filter has heretofore been employed to restrict the bandwidth of the digital signal. The digital filter is suitable for use as a transmission line for the digital signal in that a steep attenuation characteristic can be. Even if the attenuation characteristic is steep, no phase rotation will occur. Hence, it is customary in the prior art to utilize, at the transmitting side, an arrangement in which the pulse train signal to be input as a modulation signal into the modulator is applied to a digital filter to eliminate higher harmonics contained in the pulses.

In FIG. 1 reference numeral 10 denotes a conventional digital filter, which is made up of an N-stage shift register 11, multipliers $6_0$ to $6_{N-1}$ for multiplying the outputs of respective shift stages $S_0$ to $S_{N-1}$ of the shift register 11 by coefficients $h(i-n)$, where $i=0, 1, \ldots, 2n$, and adders $7_1$ to $7_{N-1}$ for sequentially adding the multiplied outputs to obtain a total sum of them. An analog signal from a signal source 13 such as a microphone is converted by an A/D converter 14 to a digital signal, which is converted by a parallel-serial converter 15 to a serial data signal $S(i)$, which is then provided to an input terminal 12. The data signal $S(i)$ is input into the shift register 11 bit by bit upon each occurrence of a clock CK and is shifted through the shift stages $S_0$ to $S_{N-1}$.

Pieces of bit data $S(O)$ to $S(N-1)$ in the respective stages $S_0$ to $S_{N-1}$ of the shift register 11 are extracted therefrom and provided to the multipliers $6_0$ to $6_{N-1}$ at one terminal thereof. The multipliers $6_0$ to $6_{N-1}$ are each supplied at the other input terminal with the coefficient $h(i-n)$ defining an impulse response characteristic shown in FIG. 2. The provision of the coefficient $h(i-n)$ defines, for example, the upper limit frequency of the lowpass band of the digital filter 10 and its cutoff characteristic. The multiplied outputs of the multipliers $6_0$ to $6_{N-1}$ are added by the analog adders $7_1$ to $7_{N-1}$ to obtain a total sum, i.e.

$$\sum_{i=0}^{N-1} S(i) \cdot h(i-n)$$

and an analog signal of an amplitude equal to the value of the total sum is provided at an output terminal 18.

For instance, in the case of forming, as the digital filter 10, a 20-order FIR filter by hardware, one 20-bit shift register 11, 20 multipliers $6_0$ to $6_{N-1}$ and 19 adders $7_1$ to $7_{N-1}$ are needed and the circuit scale is large. This hardware structure is not particularly suitable for portable communication equipment. On this account, it is a general practice in the prior art to implement the FIR filter by forming the shift register 11, the multipliers $6_0$ to $6_{N-1}$ and the analog adders $7_1$ to $7_{N-1}$ by a microcomputer.

In the case of the digital filter 10 being formed by a microcomputer, it is hard to speed up its operation, because the microcomputer needs to repeatedly execute as many as 20 steps of multiplications and analog additions each time the data of the shift register 11 is shifted one bit position. Consequently, in the case of forming a lowpass filter, its treble cutoff frequency cannot be set high, that is, a relatively high-speed digital signal cannot be transmitted. Moreover, since the throughput of the microcomputer is consumed in association with the digital filter alone, the time for executing other control programs is reduced, and hence the control function cannot be improved.

SUMMARY OF THE INVENTION

It is therefore an object of the present invention to provide a digital filter which is free from the necessity of employing a microcomputer and is capable of high-speed operation.

The digital filter of the present invention is made up of: shift register means into which a pulse train signal is fetched bit by bit after being sampled; a memory which is supplied at its address input terminals with data from predetermined stages of the shift register means as an address data and which has stored therein at each address the value of a total or partial sum of multiplied data obtained by multiplying coefficients defining a desired impulse response characteristic and bit data representing the address; and a D/A converter whereby the total or partial sum of the multiplied data read out of the memory is D/A converted to extract an analog voltage.

With such an arrangement, there is prestored, in the memory at an address corresponding to data read out of the shift register means, the value of the total or partial sum of the multiplied values obtained by multiplying each bit data provided to the address and responding to one of the coefficients defining the impulse response characteristic. Hence, the output of the digital filter can be obtained simply by reading out the value of the total or partial sum of the multiplied values prestored at each address and then D/A converting the sum data of the total or partial sum thus read out.

Consequently, only the time for accessing the memory and the time for D/A conversion are needed to obtain the output of the digital filter for each step, and hence the speed-up of operation of the digital filter can be achieved. Thus, the treble cutoff frequency of the filter can be set high.

DESCRIPTION OF THE PREFERRED EMBODIMENTS

Figure 3:
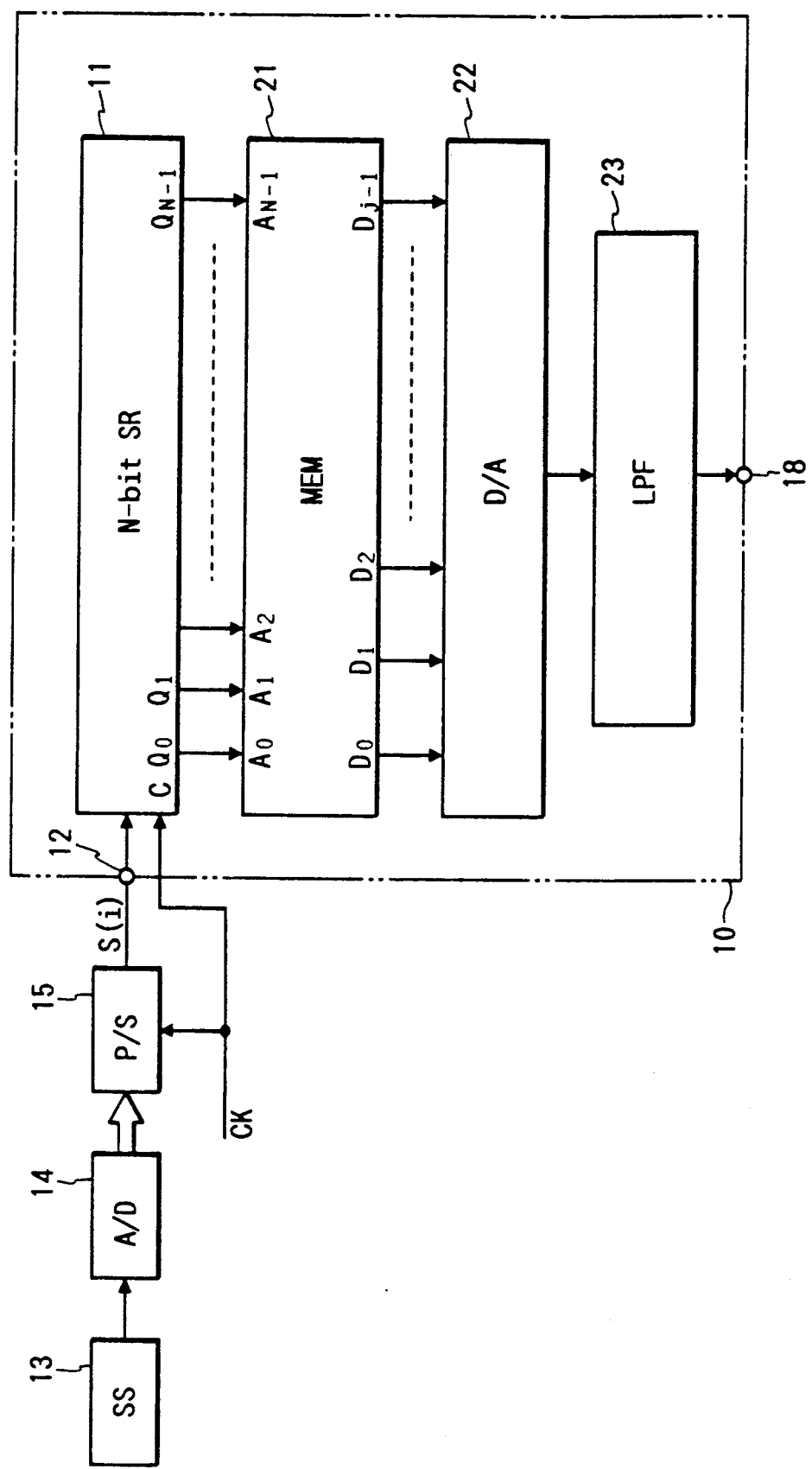
FIG. 3 is a block diagram illustrating a first embodiment of the digital filter of the present invention.

FIG. 3 illustrates an example of the construction of the digital filter 10 according to the present invention. Reference numeral 11 indicates an N-bit shift register, 21 a memory, 22 a D/A converter and 23 a smoothing circuit formed of a lowpass filter.

Figure 1:
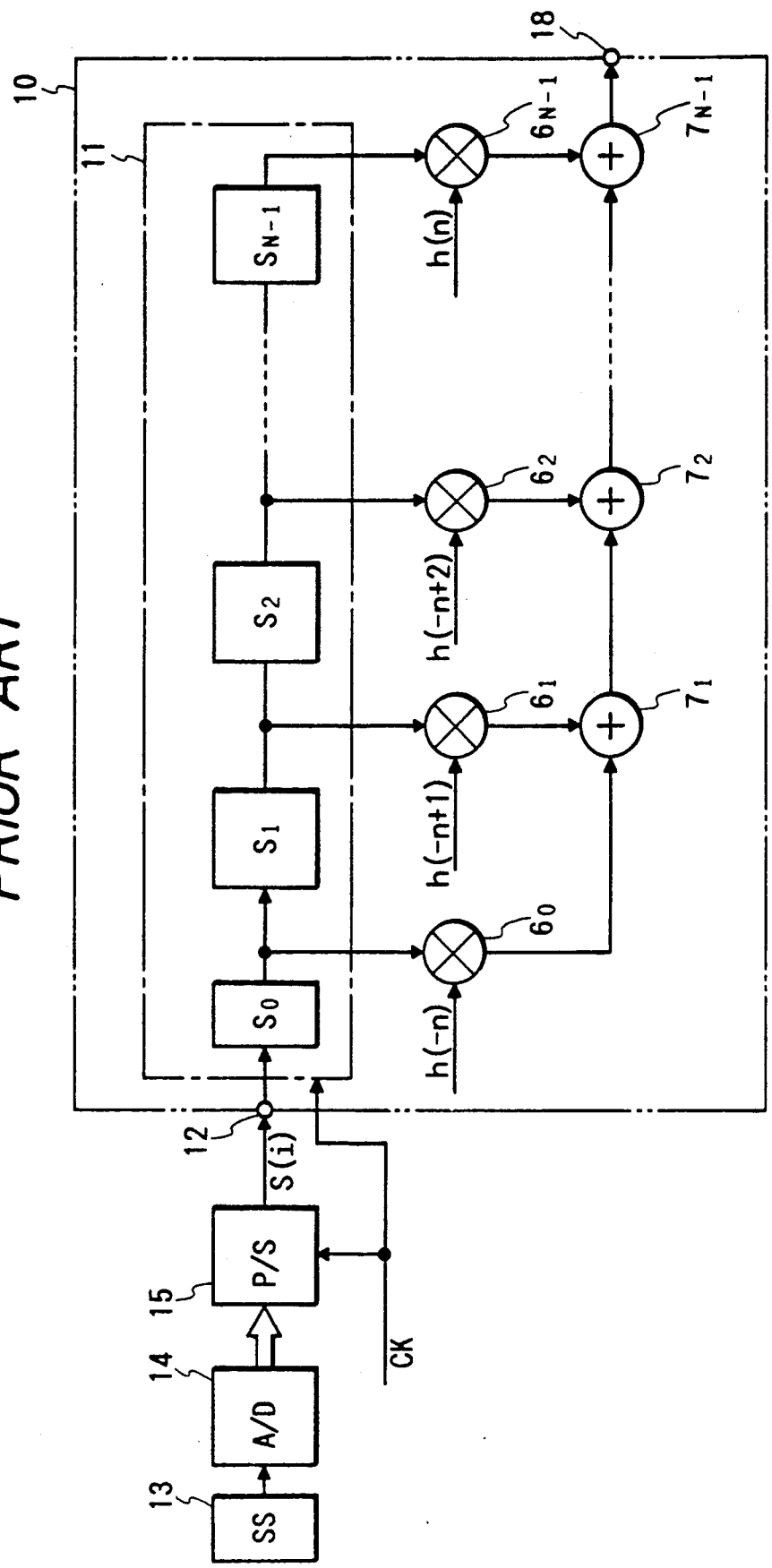
FIG. 1 is a block diagram showing a conventional digital filter.

As is the case with the prior art example of FIG. 1, an analog signal from the signal source 13 is converted by the A/D converter 14 to a digital signal, which is, in turn, converted by the parallel-serial converter 15 to the serial data signal S(i), which is applied to the input terminal 12 of the N-bit shift register 11. The serial signal S(i) applied to the input terminal 12 is fetched into the shift register 11 on a bitwise basis in synchronization with the clock CK. The shift register 11 has output terminals $Q_0$ to $Q_{N-1}$ connected to the N shift stages, respectively, and provides thereto as a set of parallel data a sequence of N-bit data Q(0) to Q(N−1) in the serial signal, as in the case of FIG. 1. The set of N-bit data Q(0) to Q(N−1) are input as address data into address input terminals $A_0$ to $A_{N-1}$ of the memory 21.

In the memory 21 there is prestored at each address a value obtained by multiplying the value (1 or 0) of each bit of the N-bit data, indicating the address, by the corresponding one of the N coefficients h(i−n), where i=0, 1, . . . , N−1 and N=2n+1. Letting the N-bit address data be represented by {Q(0), . . . , Q(N−1)}, a value computed by the following equation is prestored at each address {Q(0), . . . , Q(N−1)}:

$$\Omega = \sum_{i=0}^{N-1} Q(i) \cdot h(n-1) \quad (1)$$

Thus, by providing as address signals the N-bit data to the address input terminals $A_0$ to $A_{N-1}$, it is possible to provide at output terminals $D_0$ to $D_{j-1}$ the total sum $\Omega$ of values obtained by multiplying the respective pieces of the N-bit data by the corresponding coefficients h(i−n). The total sum value $\Omega$ thus provided at the output terminals $D_0$ to $D_{j-1}$ of the memory 21 is converted by the D/A converter 22 to an analog voltage and the stepwise-varying analog output voltage is provided to the output terminal 18 after being smoothed by the lowpass filter 23.

As will be appreciated from the above, only the time for accessing the memory 21 and the time for the D/A conversion by the D/A converter 22 are needed to obtain the output voltage from the digital filter 10 according to the present invention. In other words, the time from the input of the N-bit digital data to the terminal 12 to the output of the output voltage can be reduced. Hence, it is possible to form a digital filter which has a high treble cutoff frequency and is capable of high-speed operation.

Figure 4:
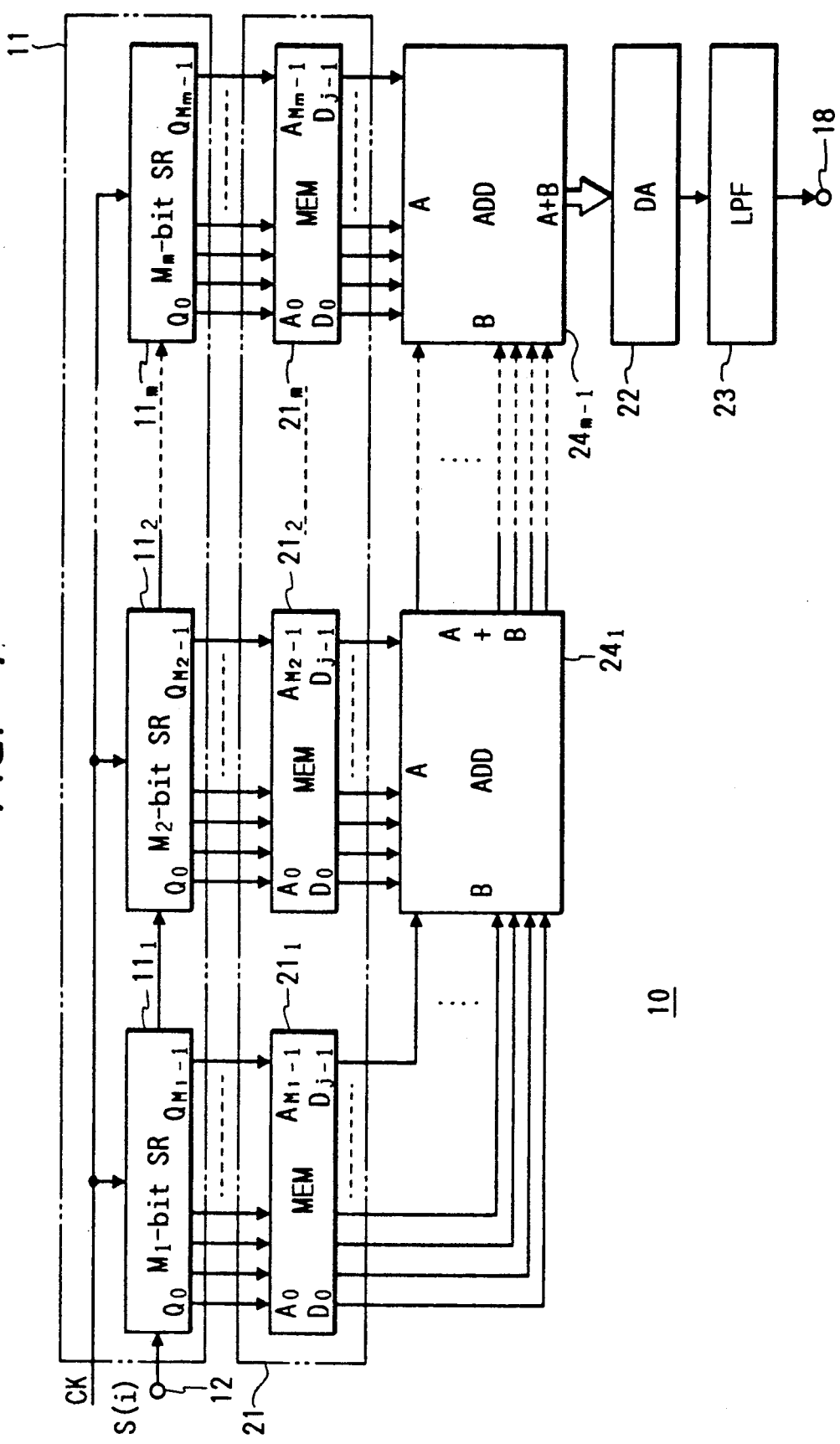
FIG. 4 is a block diagram illustrating a second embodiment of the digital filter of the present invention which employs a split memory structure.

FIG. 4 illustrates a second embodiment of the digital filter according to the present invention. In this embodiment the shift register 11 is split either actually or figuratively into shift register parts $11_1$ to $11_m$ of $M_1$ to $M_m$ bits and pieces of data Q(0) to Q($M_1-1$), Q(0) to Q($M_2-1$), . . . , Q(0) to Q($M_m-1$) of $M_1$, $M_2$, . . . , $M_m$ bits from shift stages of the shift register parts $11_1$ to $11_m$ are respectively output as address data.

Figure 2:
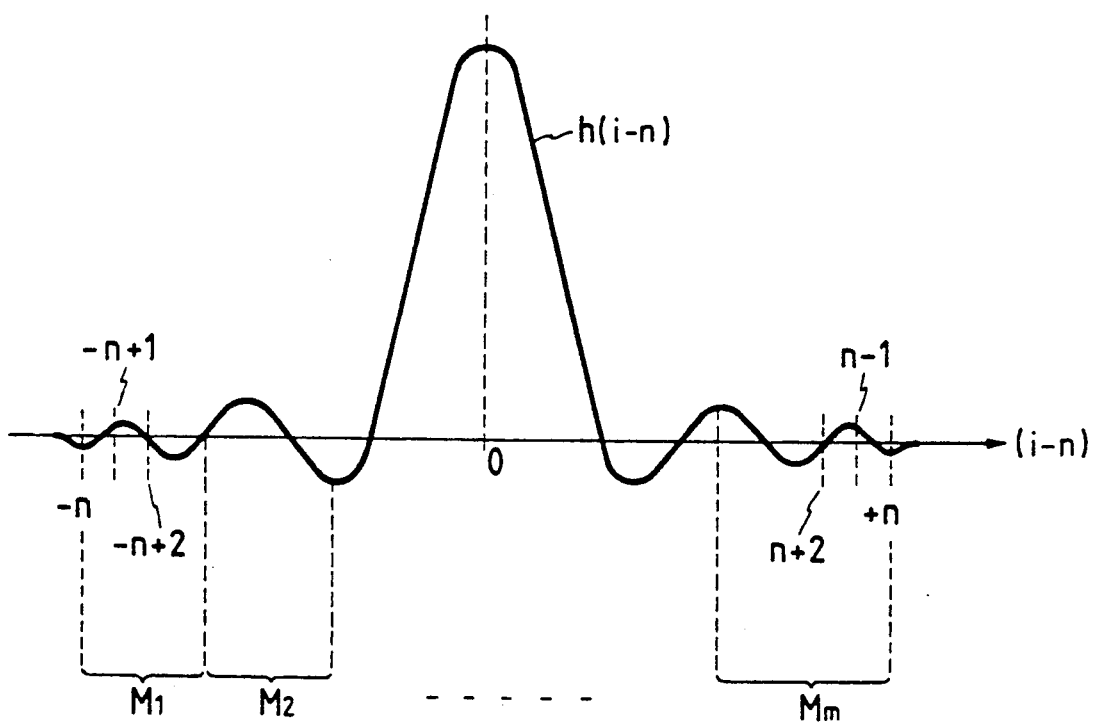
FIG. 2 is a graph showing an example of an impulse response characteristic which is provided as a coefficient to the digital filter.

The memory 21 is also split into memory blocks $21_1$ to $21_m$ of the same number as the shift register parts $11_1$ to $11_m$. The memory blocks $21_1$ to $21_m$ are each formed by a ROM and are supplied with the outputs from shift stages of the shift registers $11_1$ to $11_m$ as addresses. The coefficient h(i−n) which represents the impulse response characteristic shown in FIG. 2 is split into $M_m$ coefficient groups in correspondence with the division of the shift register 11 and the memory 21. In the memory blocks $21_1$ to $21_m$ there are prestored at their respective addresses partial sums $\Omega_1$ to $\Omega_m$ of the results of multiplications which are obtained by multiplying values of the addresses and the coefficients h(i−n) corresponding to the memory blocks and which are given by the following equations.

$$\Omega_1 = \sum_{i=0}^{M_1-1} Q(i) \cdot h(i-n) \quad (2)$$

$$\Omega_2 = \sum_{i=0}^{M_2-1} Q(i) \cdot h(i+M_1-n)$$

$$\Omega_m = \sum_{i=0}^{M_m-1} Q(i) \cdot h(i+M_1+M_2+\ldots+M_{m-1}-n)$$

By dividing the memory 21 into such memory blocks $21_1$ to $21_m$ the total storage capacity needed can be reduced. In the FIG. 3 embodiment in which the memory 21 is formed by a single memory, the construction of, for example, a 101-order FIR filter calls for a memory having a capacity of $2^{101} \simeq 2.535 \times 10^{30}$ words in the case where N=101, that is, the address length is 101 bits long and one-word data is stored at each address. Such a memory is impractical. In contrast thereto, in the case where m=10, for instance, and the memory 21 is formed by 10 blocks consisting of memories $21_1$ to $21_9$ (that is, $M_1 = M_2 = \ldots = M_9 = 10$) of 10 bits long addresses, for example, and one memory $21_{10}$ (that is, M=11) of 11 bits long addresses, nine ROMs having a capacity of 1K words and one ROM having a capacity of 2K words are used and the total storage capacity is $9 \times 2^{10} + 2^{11} = 1126$ words, i.e. 11K words.

The outputs of the memory blocks $21_1$ to $21_m$ are respectively added by adders $24_1$ to $24_{m-1}$, and the added output is converted by the D/A converter 22 to analog form and smoothed by the lowpass filter 23, thereafter being provided to the output terminal 18.

In the above-described example in which m=10 the memory blocks $21_1$ to $21_9$ are described to have the 1K words capacity and the memory block $21_{10}$ is described to have the 2K words capacity, but all the memory blocks may be formed by memories of the same 2K words capacity. Moreover, although the memory blocks $21_1$ to $21_m$ are described to be formed by ROMs, it is also possible to implement a digital filter whose characteristic can properly be switched by using DRAMs or SRAMs to form the memory blocks $21_1$ to $21_m$ so that a desired coefficient h(i-n) can be re-written. The same is true of the FIG. 3 embodiment.

In the embodiment of FIG. 3 one symbol (one sign bit represented by the H or L level) of the input serial data signal S(i) from the terminal 12 is fetched into the shift register 11 upon each occurrence of the clock CK. This is equivalent to the sampling of the input signal by the clock CK of the same rate as its symbol rate (or bit rate), but this is not preferable because folding noise (i.e. aliasing noise) enters the frequency band of the input signal as the result of sampling. To avoid this, provision is made for transferring the folding noise to a frequency region sufficiently higher than that of the input signal S(i), by fetching the input signal into the shift register after sampling it by a clock of a rate sufficiently higher than the symbol rate of the input data signal through use of a method called oversampling. Through utilization of such an oversampling method the storage capacity necessary for the digital filter of the present invention can be reduced as described below in connection with FIG. 5.

Figure 5:
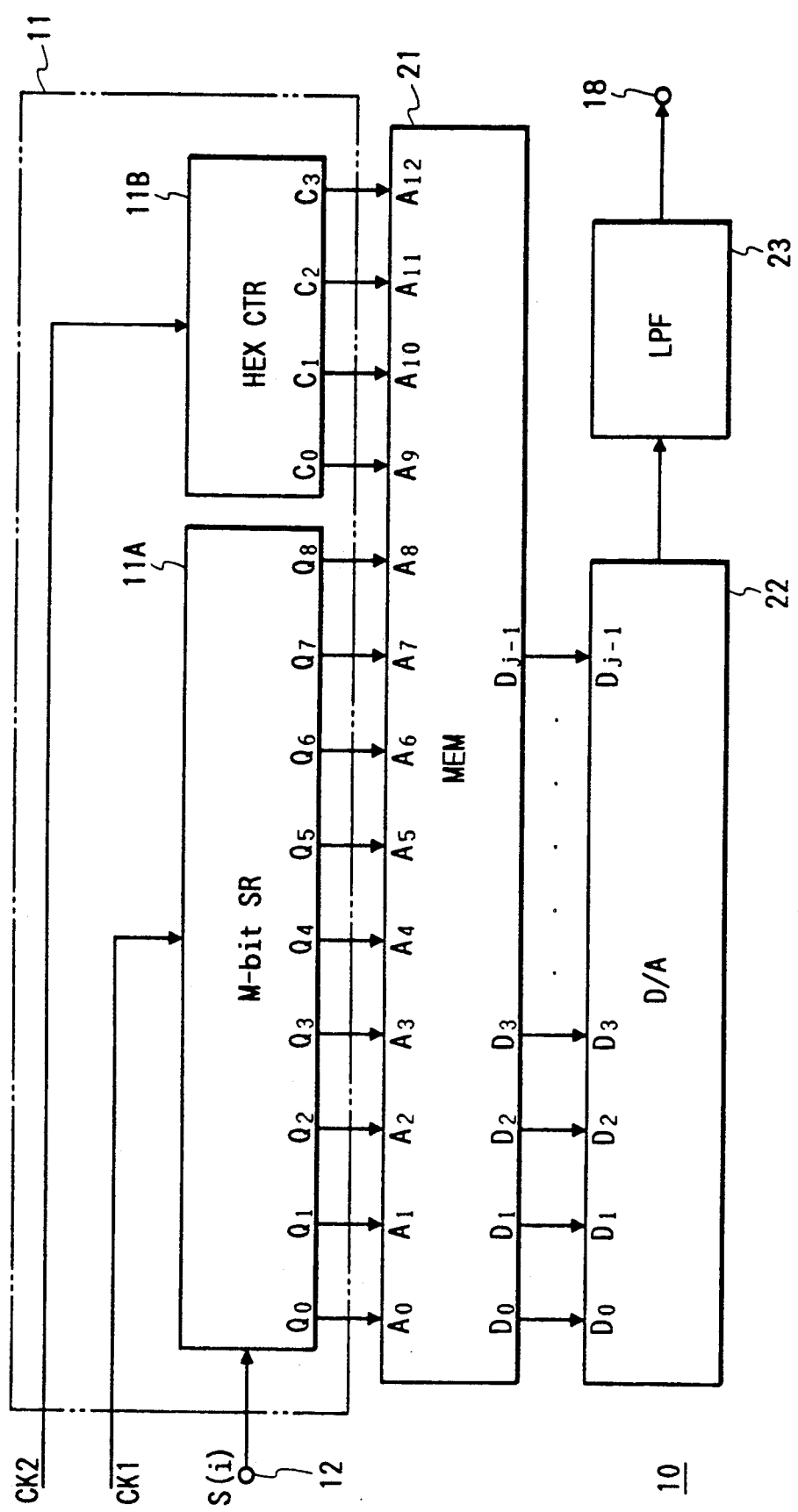
FIG. 5 is a block diagram illustrating a third embodiment of the digital filter of the present invention which employs an oversampling scheme.

The embodiment of FIG. 5 shows an example of the structure for performing, for example, 129-order FIR filtering at a sampling rate 16 times higher than the bit rate of the input serial data signal S(i). The 16-times oversampling of the input signal S(i) is to fetch the input signal S(i) into the shift register while sampling it 16 times for each symbol (or bit), and the 16 pieces of sample data have the same value. Hence, if a 129-stage shift register is employed to form a 129-order digital filter in FIG. 3 or 4, only pieces of data of one bit of the input signal data and the preceding eight bits are held in the 129 shift stages of the shift register 11 while the same bit of the input signal is sampled 16 times and input into the shift register 11, and the input signal data does not change during the 16 sampling periods. Upon each occurrence of an oversampling clock CK2 the input signal data of these nine bits is phase shifted in the 129-stage shift register by 1/16 of one symbol (bit) width of the input signal.

The quotient and remainder of the division of N by K, for example, can be represented by M' and R respectively, that is, N/K = M' + (R/K) (where $0 \leq R < K$). In the case of performing N-order filtering of the input data signal S(i) through the N-stage shift register 11 at a clock rate K times higher than the bit rate of the input signal in the FIG. 3 embodiment, if R>0, then a complete symbol waveform of a maximum of M' bits and a partial symbol waveform of R/K bits of the input data are held in the N-stage shift register 11, and these pieces of data are output as N-bit data from the N shift stages and used for filtering processing. It is therefore necessary, in the FIG. 5 embodiment, that the input signal data of M'+1 bits be always held in the shift register 11. With R=0, if the pieces of input signal data are sequentially fetched into the N-stage shift register 11 at the clock rate K times higher than the bit rate of the input data signal in FIG. 3, the input signal data of the full M' bits is just held in the shift register 11 at the time of occurrence of a certain one of a series of K clock pulses. Upon the occurrence of the next clock CK, the first 1/K symbol portion of the next bit of the input signal data is sampled and fetched into the first shift stage of the shift register 11, and at the same time, the first 1/K symbol portion of the oldest bit of the input signal data in the last shift stage of the shift register 11 is discarded. As the result of this, there is held in the N-bit shift register 11 a sequence of input signal data of M'+1 bits including incomplete symbol bits at both ends thereof, and this number (M'+1) does not change while the clock is further provided (K−1) times. These bits are all used for filtering processing. That is, even in the case where R=0, input signal data of M'+1 bits is needed for N-order filter processing by the K-times oversampling. It is therefore necessary, in either of the cases where R≠0 and R=0, that input signal data of M'+1 bits be held in the shift register 11A upon each occurrence of the clock CK in the FIG. 5 embodiment. In other words, the construction of the N-order filter for the K-times oversampling operation calls for the M-bit shift register 11A and a K-nary counter 11B (a counter which is reset upon each occurrence of the K-th clock CK2), and M is a minimum integer which is greater than N/K represented as M=⌈N/K⌉.

In the embodiment of FIG. 5 the input signal data S(i) is input into the shift register 11A having M=9 shift stages, in synchronization with the clock CK1 equal to the bit rate of the input signal data S(i), and the input data is shifted through the respective shift stages. On the other hand, there is provided the K=hexadecimal counter 11B, which counts the clock CK2 of the rate 16 times higher than that of the clock CK1; namely, the counter 11B counts the clock CK2 16 times each time the input serial signal S(i) is shifted one bit position in the shift register 11A. The respective count values of the hexadecimal counter 11B represent the state in which the 9-bit signal data input into the shift register 11A has virtually been phase shifted by 1/16 symbol width upon each occurrence of the sample clock CK2. Hence, by a combination of data available at output terminals $Q_0$ to $Q_8$ of the shift register 11A and data available at output terminals $C_0$ to $C_3$ of the hexadecimal counter 11B, it is possible to define the states of output data Q(0) to Q(128) from 129 shift stages in the case where the input signal data S(i) has virtually been input into a shift register of 129 shift stages through use of the 16-times oversampling technique. That is to say, a virtually N-bit shift register is implemented by the M-bit shift register 11A and the K-nary counter 11B. The outputs Q(0) to Q(8) of the shift register 11A and the output C(0) to C(3) of the hexadecimal counter 11B are provided as address data to the memory 21.

In the memory 21 there is prestored at each 13-bit address {Q(0), ..., Q(8), C(0), ..., C(3)} the result of calculation determined as described below. Letting the output from an i-th (where i=0, 1, ..., 128) shift stage of the virtual shift register of 129 shift stages be represented by q(i) and the decimal value C of the count value of the K-nary counter 11B be represented by $$C = C(0) + C(1) \times 2 + C(2) \times 4 + C(3) \times 8$$

then q(i) can be expressed by the following equation:

$$q(i) = Q\left(\left\lceil \frac{i-C}{16} \right\rceil\right) \quad (3)$$

In the above, when $0 \leq i < C$, it holds that $\lceil (i-C)/16 \rceil = 0$, that is, $q(i) = Q(0)$. The value to be stored at the address {Q(0), ..., Q(8), C(0), ..., C(3)} is calculated by $$\Omega = \sum_{i=0}^{128} q(i) \cdot h(-i - 64) = \sum_{i=0}^{128} Q\left(\left\lceil \frac{i-C}{16} \right\rceil\right) \cdot h(i - 64) \quad (4)$$

In general, in the case of performing the N-order (where N=2n+1) filtering through use of the K-times oversampling, the shift register 11A of M=⌈N/K⌉ shift stages and the K-nary counter 11B are used and the value Ω which is calculated by the following equation is prestored at each address {Q(0), ..., Q(M−1), C(0), ..., C(K−1)} of the memory 21 where k represents the number of bits of the count output.

$$\Omega = \sum_{i=0}^{N-1} q(i) \cdot h(i - n) = \sum_{i=0}^{N-1} Q\left(\left\lceil \frac{i-C}{K} \right\rceil\right) \cdot h(i - n) \quad (5)$$

In the case where N=129 and K=16, the required capacity of the memory 21 is $2^{13} = 8192$ words, i.e. only 8K words, since the number of address bits used is 9+4=13. In contrast to this, the realization of a similar filter through utilization of the construction shown in FIG. 3 calls for a memory of as large a capacity as $2^{129} \approx 6.8 \times 10^{38}$ words, and hence is almost impossible.

Figure 6:
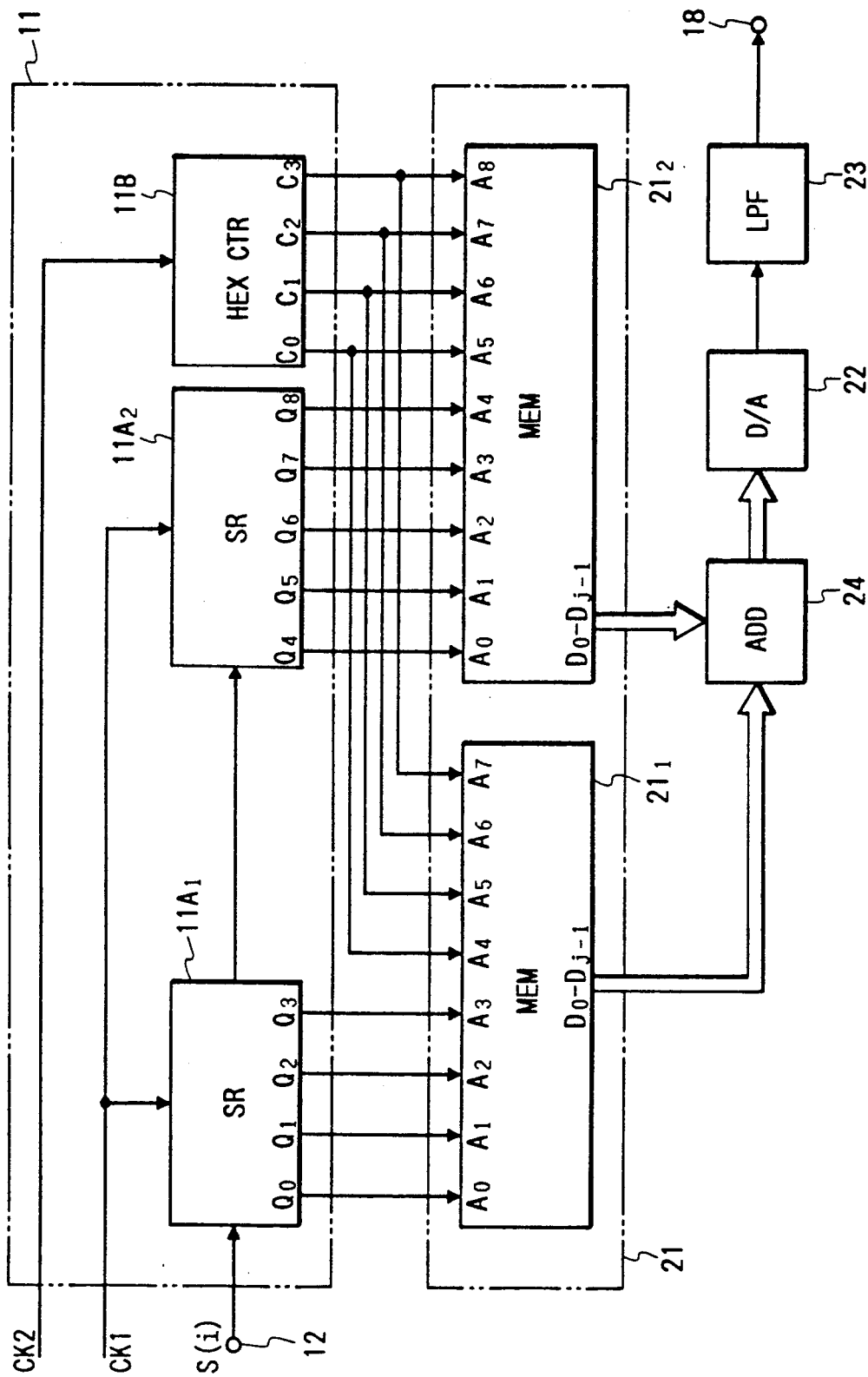
FIG. 6 is a block diagram illustrating still a fourth embodiment of the digital filter of the present invention which employs both of the split memory structure and the oversampling scheme.

FIG. 6 illustrates a modified form of the FIG. 5 embodiment, in which the memory 21 is made up of two memories $21_1$ and $21_2$ by the application of the memory splitting method used for the FIG. 4 embodiment. Accordingly, the shift register 11A is also formed by a series connection of a 4-bit shift register $11A_1$ and 5-bit shift register $11A_2$. It is a matter of course that the combination of the shift registers $11A_1$ and $11A_2$ may be replaced with one 9-bit shift register. A set of 4-shift stage outputs Q(0) to Q(3) of the shift register $11A_1$ and 4-bit output C(0) to C(3) of the hexadecimal counter 11B is provided as 8-bit address data to address terminals $A_0$ to $A_7$ of the memory $21_1$, and 5-shift stage outputs Q(4) to Q(8) of the shift register $11A_2$ and the 4-bit outputs C(0) to C(3) of the hexadecimal counter 11B are provided as 9-bit address data to address terminals $A_0$ to $A_8$ of the memory $21_2$.

In the memory $21_1$ there is prestored at each address {Q(0), ..., Q(3), C(0), ..., C(3)} a value given by $$\Omega_1 = \sum_{i=0}^{n-1} Q\left(\left\lceil \frac{i-C}{K} \right\rceil\right) \cdot h(i - n) \quad (6)$$

Similarly, there is prestored in the memory $21_2$ at each address {Q(4), ..., Q(8), C(0), ..., C(3)} a value given by $$\Omega_2 = \sum_{i=n}^{2n} Q\left(\left\lceil \frac{i-C}{K} \right\rceil\right) \cdot h(i - n) \quad (7)$$

Values read out of the memories $21_1$ and $21_2$ are added together by the adder 24 and the added output is provided as a piece of sampled data of filtered output to the D/A converter 22.

In the embodiment of FIG. 6 the required capacities of the memories $21_1$ and $21_2$ are $2^8 = 256$ words and $2^9 = 512$ words, respectively, and total capacity is only 768 words. This is less than 1/10 that needed in the FIG. 6 embodiment.

Although the embodiment of FIG. 6 is shown to include two groups of shift stages corresponding to the two shift registers $11_{A1}$ and $11_{A2}$, the entire M shift stages may be divided, in general, into m groups where m is an integer equal to or greater than 2, and the corresponding number m of memory blocks $21_1, 21_2, \ldots 21_m$ may be provided as is the case in FIG. 4. In this case, let the m groups include $M_1, M_2, \ldots M_m$ shift stages, respectively, and the shift stage outputs of each group are sequentially denoted starting at $Q_0$ in a manner similar to that shown in FIG. 4. A partial sum value is then prestored at an address of each of m memory blocks defined by a combination of outputs of the corresponding one of the m shift stage groups and the count output is defined as follows:

$$\Omega_1 = \sum_{i=0}^{M_1 K - 1} Q\left(\left\lceil \frac{i-C}{K} \right\rceil\right) h(i - n) \quad (8)$$

$$\Omega_2 = \sum_{i=0}^{M_2 K - 1} Q\left(\left\lceil \frac{i-C}{K} \right\rceil\right) h(i + M_1 K - n)$$

$$\Omega_m = \sum_{i=0}^{(M_m - 1)K} Q\left(\left\lceil \frac{i-C}{K} \right\rceil\right) h(i + M_1 K + M_2 K + \ldots + M_{m-1} K - n)$$

Figure 7:
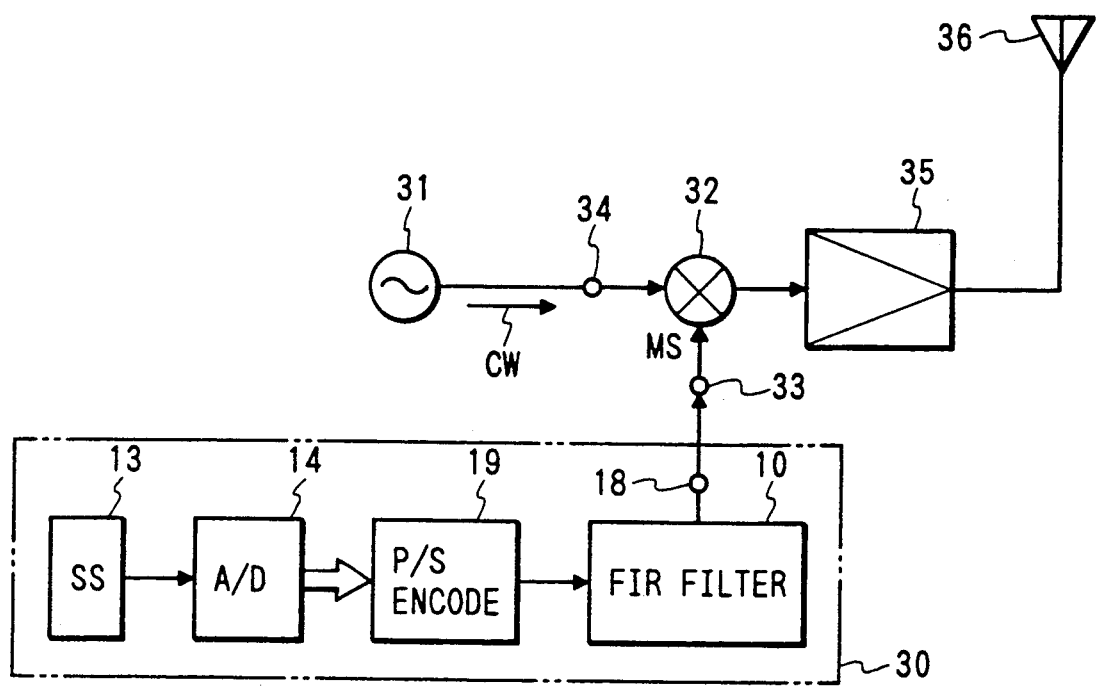
FIG. 7 is a block diagram showing an example of a transmitter utilizing the digital filter of the present invention.

FIG. 7 illustrates an example of a transmitter utilizing the digital filter 10 of the present invention. This example shows a structure for transmitting an amplitude-modulated carrier. A modulator 32 is supplied at a carrier input terminal 34 with a carrier CW from an oscillator 31 and at a modulation signal input terminal 33 with a modulation signal MS from a modulation signal source 30. The modulation signal source 30 comprises an analog signal source 13, an A/D converter 14 for converting an analog signal thereto to a digital signal, an encoder 19 which converts the digital signal to a serial signal and, if necessary, encodes the serial signal by appending thereto packet information or the like, and the digital filter 10 of the present invention which restricts the encoded serial signal within a predetermined bandwidth.

Figure 8:
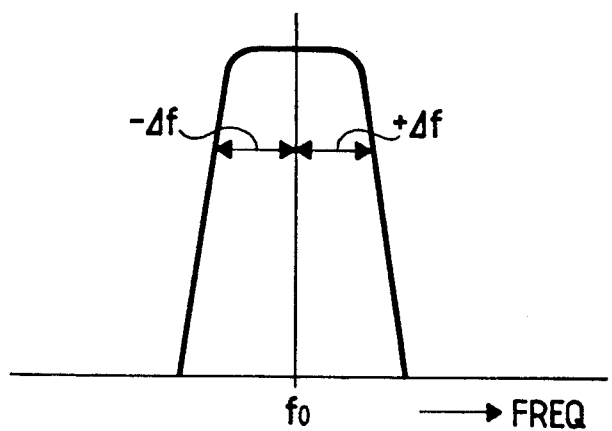
FIG. 8 is a graph showing the band characteristic of an electric wave that the transmitter shown in FIG. 7 transmits.

The digital filter 10 is set to a low-pass characteristic having a required treble cutoff frequency, by which the frequency component of the modulation signal MS to the modulation signal input terminal 33 of the modulator 32 is restricted within a predetermined bandwidth. By applying such a band-restricted modulation signal MS to the modulator 32, the bandwidth of the electric wave that is emitted from a high-frequency amplifier 35 via an antenna 36, i.e. the bandwidth Δf of side bands centering about the carrier $f_0$ as shown in FIG. 8, is restricted by the bandwidth of the digital filter 10. Incidentally, at the receiving side the received signal is shaped by a waveform shaper to pulse form, the pulse signal is converted by a serial-parallel converter to parallel form, and the thus converted digital signal is subjected to D/A conversion, by which the original analog signal can be reproduced.

As described above, according to the present invention, it is possible to provide a digital filter which is capable of a high-speed operation corresponding to high-speed digital data. Besides, the bandwidth of data can be limited as desired. In addition, the treble cutoff frequency of the filter can freely be set by a suitable selection of the coefficient h(i-n) and the cutoff characteristic can be set to be steep. This increases the ratio of elimination of signals in unnecessary bands. Furthermore, the digital filter of the present invention does not suffer from excessive phase rotation, and hence permits the transmission of almost jitter-free signals.

It will be apparent that many modifications and variations may be effected without departing from the scope of the novel concepts of the present invention.

What is claimed is:

1. A digital filter comprising:

M-bit shift register means, for sequentially receiving pieces of an input pulse train signal having a fixed symbol rate in synchronization with a first clock equal to the symbol rate of said input pulse train signal, M being the smallest integer larger than N/K, N being an integer defined substantially by N=2n+1, where n is a positive integer, and K is an integer greater than 1;

counter means for resetting upon each counting of K second clocks of a rate K times higher than that of said first clock;

memory means for receiving, as a readout address, a combination of outputs expressed by Q(0), Q(1), . . . Q(M−1), from respective shift stages of said shift register means and a count output of said counter means expressed by C(0), C(1), . . . C(K−1), where k is an integer greater than 1, said memory means having stored at each address a value of a total sum of N multiplied values defined by $$\Omega = \sum_{i=0}^{N-1} Q\left(\left\lceil \frac{i-C}{K} \right\rceil\right) h(i-n)$$

where C is a decimal value of the count output C(0), . . . C(k−1), h(i-n) represents an ith one of 2n+1 coefficients defining a predetermined impulse response of an N-order filter, and [(i−C)/k] represents a smallest integer larger than (i-C)/K; and D/A converting means for converting the value of said total sum read out of said memory means to an analog signal.

2. The digital filter of claim 1, wherein said memory means is a reloadable memory.

3. The digital filter of claim 1, further comprising low-pass filter means which smoothes said analog signal from said D/A converting means.

4. A digital filter comprising:

M-bit shift register means sequentially supplied with pieces of an input pulse train signal of a fixed symbol rate in synchronization with a first clock equal to the symbol rate, M being the smallest integer larger than N/K, N being an integer defined substantially by N=2n+1, where n is a positive integer and K being an integer greater than 1, said M-bit shift register means defining m serial groups of stages, m being an integer equal to or greater than 2, the number of shift stages in respective m groups being represented by $M_1, M_2, \ldots M_m$, and said m groups providing outputs Q(0), Q(1), . . . $Q(M_1-1)$; Q(0), Q(1) . . . $Q(M_2-1)$; . . . Q(0), Q(1) . . . $Q(M_m-1)$;

counter means reset upon each counting of K second clocks having a rate K times higher than that of said first clock and providing a count output of k bits represented by C(0), C(1) . . . C(k−1), k being an integer greater than 2;

m split memories each for receiving a combination of outputs from corresponding ones of said m shift stage groups and said count output from said counter means as a readout address, each of said m split memories prestoring at each address thereof a partial sum value defined by $$\Omega_1 = \sum_{i=0}^{M_1K-1} Q\left(\left\lceil \frac{i-C}{K} \right\rceil\right) h(i-n)$$

$$\Omega_2 = \sum_{i=0}^{M_2K-1} Q\left(\left\lceil \frac{i-C}{K} \right\rceil\right) h(i+M_1K-n)$$

$$\Omega_m = \sum_{i=0}^{(M_m-1)K} Q\left(\left\lceil \frac{i-C}{K} \right\rceil\right) h(i+M_1K+M_2K+\ldots+M_{m-1}K-n)$$

where C is a decimal value of the count output C(0), C(1) . . . C(k−1), h(i-n) represents an ith one of 2n+1 coefficients defining a predetermined impulse response of an N-order filter, and [(i−C)/K] represents the smallest integer larger than (i-C)/K;

adding means for calculating a total sum value of the partial sums read out from said m split memories; and D/A converting means for converting the total sum value from said adding means to an analog signal.

5. The digital filter of claim 4, wherein said m split memories are reloadable memories.

6. The digital filter of claim 4, further comprising low-pass filter means which smoothes said analog signal from said D/A converting means.

* * * * *